(12) United States Patent
Akimoto et al.

(10) Patent No.: US 7,417,249 B2
(45) Date of Patent: Aug. 26, 2008

(54) SEMICONDUCTOR DEVICE HAVING A WIRING INCLUDING AN ALUMINUM CARBON ALLOY AND TITANIUM OR MOLYBDENUM

(75) Inventors: Kengo Akimoto, Kanagawa (JP); Satoshi Murakami, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 289 days.

(21) Appl. No.: 11/202,313

(22) Filed: Aug. 12, 2005

(65) Prior Publication Data

US 2006/0038176 A1 Feb. 23, 2006

(30) Foreign Application Priority Data

Aug. 20, 2004 (JP) .............................. 2004-240682

(51) Int. Cl.
*H01L 31/036* (2006.01)
(52) U.S. Cl. .......................................... 257/59; 349/44
(58) Field of Classification Search .................. 257/59, 257/72; 349/44
See application file for complete search history.

(56) References Cited

U.S. PATENT DOCUMENTS

| | | | |
|---|---|---|---|
| 5,623,157 A | 4/1997 | Miyazaki et al. | |
| 5,640,067 A | 6/1997 | Yamauchi et al. | |
| 5,767,529 A | 6/1998 | Kobori et al. | |
| 5,804,878 A | 9/1998 | Miyazaki et al. | |
| 5,897,328 A | 4/1999 | Yamauchi et al. | |
| 5,929,527 A | 7/1999 | Yamazaki et al. | |
| 5,929,948 A * | 7/1999 | Ohori et al. ................. | 349/44 |
| 6,031,290 A | 2/2000 | Miyazaki et al. | |
| 6,166,396 A | 12/2000 | Yamazaki | |
| 6,166,414 A | 12/2000 | Miyazaki et al. | |
| 6,448,612 B1 | 9/2002 | Miyazaki et al. | |
| 6,495,857 B2 | 12/2002 | Yamazaki | |
| 6,596,572 B1 | 7/2003 | Kobori et al. | |
| 6,608,353 B2 | 8/2003 | Miyazaki et al. | |
| 6,844,628 B2 | 1/2005 | Yamazaki et al. | |
| 6,853,083 B1 | 2/2005 | Yamauchi et al. | |
| 2002/0179969 A1 | 12/2002 | Miyazaki et al. | |
| 2002/0179972 A1 | 12/2002 | Yamazaki et al. | |
| 2004/0022664 A1 * | 2/2004 | Kubota et al. ................. | 420/550 |
| 2004/0023445 A1 | 2/2004 | Miyazaki et al. | |
| 2004/0051102 A1 | 3/2004 | Miyazaki et al. | |
| 2004/0227184 A1 | 11/2004 | Kobori et al. | |
| 2005/0077518 A1 | 4/2005 | Kobori et al. | |
| 2005/0145847 A1 | 7/2005 | Miyazaki et al. | |

(Continued)

FOREIGN PATENT DOCUMENTS

JP      06-232129       8/1994

(Continued)

*Primary Examiner*—Thomas L Dickey
(74) *Attorney, Agent, or Firm*—Fish & Richardson P.C.

(57) ABSTRACT

According to the present invention, wirings, electrodes or the like formed from two films (an ITO film and an aluminum film) which are incompatible with each other are connected, and low power consumption is realized even if a display screen size is increased in an active matrix display device. A three-layer structure or a two-layer structure is employed to obtain a favorable ohmic contact with ITO. The structure of a wiring or an electrode includes a layer having an aluminum carbon alloy which does not react with ITO. The wiring or an electrode is contacted with ITO.

21 Claims, 10 Drawing Sheets

U.S. PATENT DOCUMENTS

2005/0146262 A1  7/2005  Yamauchi et al.

FOREIGN PATENT DOCUMENTS

| JP | 08-330600 | 12/1996 |
|---|---|---|
| JP | 09-045927 | 2/1997 |
| JP | 10-032202 | 2/1998 |
| JP | 2004-006974 | 1/2004 |

\* cited by examiner

SEMICONDUCTOR DEVICE HAVING A WIRING INCLUDING AN ALUMINUM CARBON ALLOY AND TITANIUM OR MOLYBDENUM

BACKGROUND OF THE INVENTION

1. Field of the Invention

The present invention relates to a semiconductor device having a circuit including a thin film transistor (hereinafter, TFT) and a manufacturing method thereof. For example, the present invention relates to an electronic device having, as a component part, an electro-optic device typified by a liquid crystal display panel or a light-emitting display device with an organic light-emitting element.

Note that a semiconductor device in this specification means a generic device which can operate with use of semiconductive characteristics and includes all types devices such as an electro-optic device, a semiconductor circuit and an electronic device.

2. Description of the Related Art

In recent years, a technology for forming a thin film transistor (TFT) using a semiconductor thin film (a thickness of around several nanometers to several hundred nanometers) formed over a substrate having an insulating surface has been attracting attention. Thin film transistors are broadly applied to electronic devices such as an IC or an electro-optic device, and are particularly developed as switching elements for image display devices at a rapid rate.

Conventionally, in an active matrix type liquid crystal display device with TFT driving, a plurality of scanning lines and data lines are arranged vertically and horizontally on a substrate and a large number of TFTs are provided at intersections of the lines. A gate wiring, a source electrode and a drain electrode of each TFT are electrically connected to the scanning line, the data line and a pixel electrode, respectively.

In a transmissive liquid crystal display device, a transparent conductive film typified by ITO is used as the pixel electrode. The pixel electrode formed of a transparent conductive film is provided over an interlayer insulating film for insulating it from wirings such as a data line or a scanning line. Therefore, the pixel electrode is electrically connected to the drain electrode through a contact hole formed in the interlayer insulating film.

Specifically, there is a problem of a signal delay due to wiring resistance in manufacturing a display device for large-size display. Therefore, a material having low electric resistance, typically aluminum, is used as the material for wirings or electrodes.

Aluminum used as a material of wirings or electrodes is incompatible with ITO used as a material of a pixel electrode in the junction, and thus there is a problem in that an electric corrosion is caused when the both are directly contacted.

When an aluminum film and an ITO film are directly contacted, aluminum is oxidized and ITO is reduced at the contact surface, and thus contact resistance is varied. It is known that this is a phenomenon of an electrochemical reaction caused due to differences in the electrode potentials of aluminum and ITO.

There is proposed a technique of preventing an electric corrosion with ITO by providing a high-melting point metal film (such as a titanium film), a high-melting metal compound film (such as a titanium nitride film) or the like between an aluminum wiring (or electrode) and the ITO, when connecting wirings or electrodes formed using the both films, which are incompatible with each other.

References 1, 2, and 3 describe that the connection between a drain of a thin film transistor and ITO as a pixel electrode is made by stacking a titanium film, an aluminum film, and a titanium film (Reference 1: Japanese Patent Laid-Open No. H9-45927, Reference 2: Japanese Patent Laid-Open No. H10-32202, and Reference 3: Japanese Patent Laid-Open No. H6-232129).

Reference 4 describes that the connection between a drain of a thin film transistor and ITO as a pixel electrode is made by stacking a titanium film and an aluminum film, and Reference 5 describes that the connection between a drain of a thin film transistor and ITO as a pixel electrode is made by stacking a titanium nitride film and an aluminum film (Reference 4: Japanese Patent Laid-Open No. 2004-6974 and Reference 5: Japanese Patent Laid-Open No. H8-330600).

However, when a titanium film or a titanium nitride film is formed between an aluminum wiring (or electrode) and ITO, wiring resistance is increased and power consumption is also increased if the size of a display screen is made larger. The wiring resistance can be decreased by enlarging the cross sectional area of a metal film to serve as a wiring; however, if the film thickness is made thicker and the cross sectional area is increased, a step between a surface of a substrate and a surface of a wiring having the thick film thickness is produced, which is a cause of an orientation failure of a liquid crystal.

In an active matrix type light-emitting device with TFT driving, there is a case where a transparent conductive film is used as an anode (or cathode) of a light-emitting element. Similarly, the anode formed of a transparent conductive film is formed over an interlayer insulating film for insulating it from various types of wirings. Therefore, the above described electric corrosion is similarly generated when ITO is used as an anode and connected to an electrode (aluminum) of a TFT.

SUMMARY OF THE INVENTION

The present invention has been made in view of the above described problems. It is an object of the present invention to, in an active matrix display device, connect wirings, electrodes or the like formed from two films (an ITO film and an aluminum film) which are incompatible with each other without increasing the cross sectional area of the wirings, and to realize low power consumption if a display screen size is increased.

When aluminum is used as a wiring material for forming a TFT, projections such as hillock or whisker are formed due to a heat treatment or diffusion of an aluminum atom into a channel forming region causes a defect in operation of a TFT or deterioration of TFT characteristics. In a conventional manner, hillock or the like is suppressed by using an aluminum alloy film containing another element (such as Si). There is still a problem in that aluminum is oxidized and an ITO film is reduced at the junction (contact) interface, thus the resistance by the contact is varied even when an aluminum alloy film is used.

Further, it is an object of the present invention to prevent a projection such as hillock or whisker from being formed even when aluminum is used as a wiring material, to prevent diffusion of an aluminum atom into a channel forming region, and to make an ohmic contact favorable in an active matrix display device.

According to the present invention, a three-layer structure is employed to realize the above described objects, instead of using a single layer of an aluminum alloy film for a wiring or an electrode and adjusting a composition of the aluminum alloy film to obtain a favorable ohmic contact with ITO.

According to the present invention, the above described problems are solved without providing a high-melting point metal film (such as a titanium film) or a high-melting metal compound film (such as a titanium nitride film) between an aluminum wiring (or electrode) and ITO.

According to the present invention, a first conductive layer formed from Ti or Mo is provided and a second conductive layer formed from pure aluminum with low electric resistance is provided thereover in order to prevent diffusion of an aluminum atom into a channel forming region. Further, a third conductive layer formed from an aluminum alloy which does not react with ITO is provided over the second conductive layer. Thus, a wiring or an electrode having the three-layer structure is formed and then, the wiring or electrode is connected to ITO.

The first conductive layer is preferably 20 to 200 nm thick to prevent silicon and aluminum from diffusing into each other.

In order to lower electric resistance, the oxygen concentration of the second conductive layer formed from pure aluminum is $5 \times 10^{18}$ atoms/cm$^3$ or less preferably $1 \times 10^{19}$ atoms/cm$^3$ or less. The second conductive layer is preferably 0.1 to 2 μm thick. More miniaturization can be realized by using the second conductive layer formed from pure aluminum with low electric resistance, thereby reducing the area of a circuit.

Moreover, the third conductive layer formed from an aluminum alloy which does not react with ITO is an aluminum alloy film containing Ni (nickel), Ti (titanium), Mo (molybdenum) or C (carbon). For example, an aluminum carbon alloy film in which C of 0.1 to 10 atoms % and Ni of 0.5 to 7 atoms % are included in Al, an aluminum carbon alloy film in which C of 0.1 to 10 atoms % and Ti of 1.0 to 20 atoms % are included in Al, or an aluminum carbon alloy film in which C of 0.1 to 10 atoms % is included in Al is used. The third conductive layer is preferably 5 to 200 nm thick. The aluminum carbon alloy may be also called as an aluminum-carbon alloy.

However, Ni is one of harmful materials in terms of environment, and thus the third conductive layer is preferably an aluminum alloy film containing Ti (titanium), Mo (molybdenum) or C (carbon).

These three layers are preferably formed continuously in the same sputtering apparatus so as not to oxide the surface of each layer.

A structure of the present invention disclosed in this specification is a semiconductor device including a plurality of thin film transistors having a semiconductor film as an active layer and a transparent conductive film over a substrate having an insulating surface, and the semiconductor device includes an electrode or a wiring in which a first conductive layer including pure titanium or pure molybdenum, which is in contact with the active layer, a second conductive layer including pure aluminum, which is in contact with the first conductive layer, and a third conductive layer including an aluminum alloy including carbon, which is in contact with the second conductive layer are stacked in order; and a transparent conductive layer which is on the third conductive layer.

An aluminum alloy film including carbon and titanium may be used instead of the aluminum alloy film including carbon. Another structure of the present invention is a semiconductor device including a plurality of thin film transistors having a semiconductor film as an active layer and a transparent conductive film over a substrate having an insulating surface, and the semiconductor device includes an electrode or a wiring in which a first conductive layer including pure titanium or pure molybdenum, which is in contact with the active layer, a second conductive layer including pure aluminum, which is in contact with the first conductive layer, and a third conductive layer including the aluminum alloy including carbon and titanium, which is in contact with the second conductive layer are stacked in order; and a transparent conductive layer which is on the third conductive layer.

Further, an aluminum alloy film including carbon and nickel may be used instead of the aluminum alloy film including carbon. Another structure of the present invention is a semiconductor device including a plurality of thin film transistors having a semiconductor film as an active layer and a transparent conductive film over a substrate having an insulating surface, and the semiconductor device includes an electrode or a wiring in which a first conductive layer including pure titanium or pure molybdenum, which is in contact with the active layer, a second conductive layer including pure aluminum, which is in contact with the first conductive layer, and a third conductive layer including the aluminum alloy including carbon and nickel, which is in contact with the second conductive layer are stacked in order; and a transparent conductive layer which is on the third conductive layer.

In the above described structures, one feature of the present invention is that the semiconductor device includes a light-emitting element having the transparent conductive film as an anode or a cathode, or a liquid crystal element having the transparent conductive film as a pixel electrode.

In the above described structures, one feature of the present invention is that the first, second and third conductive layers are formed continuously in the same sputtering apparatus. The surfaces of the layers are not oxidized by continuously forming the layers in the same sputtering apparatus, thereby reducing a contact resistance with the transparent conductive film and a wiring resistance.

Another structure of the present invention is a method for manufacturing a semiconductor device having a light-emitting element in the case where a transparent conductive film is formed, then an electrode having a stacked structure, and a thin film transistor is electrically connected to the transparent conductive film. The method for manufacturing a semiconductor device includes the steps of: forming a plurality of thin film transistors having a semiconductor film as an active layer over a substrate having an insulating surface; and forming a transparent conductive film to be connected to the thin film transistors, wherein an electrode which is in contact with the transparent conductive film and the active layer includes, at least, a stacked structure of a molybdenum film and an aluminum film, the electrode is patterned through a step of dry etching of the aluminum film and a step of wet etching of the molybdenum film using the same mask, and by the wet etching, the molybdenum film is selectively etched and a surface of the transparent conductive film is cleaned simultaneously.

According to the manufacturing method described above, minute particles (circular minute grains of 0.1 μm or less in diameter), which exist on the anode surface formed from a transparent conductive film (typically, ITO) can be removed at the same time as the wet etching described above. The minute particles can be thought to be dusts mixed in sputtering of the ITO film, in wet etching of a bank or in patterning of the ITO film. The minute particles are a main cause for a dark spot generated just after manufacturing a light-emitting element containing an organic compound. As to the electric characteristics of a light-emitting element formed without cleaning the surface of a transparent conductive film, almost no luminance variations depending on a voltage are observed; however, there is observed an abnormality that the luminous efficiency extremely decreases at low voltage (3 to 5V) driving. In addition, luminescent spot (a spot whose brightness is higher than those of spots in the periphery) is generated in some cases because current is concentrated locally due to the minute particles.

A light-emitting element includes an organic compound containing layer (hereinfter, an EL layer) exhibiting electroluminescence by being applied with electric field, an anode and a cathode. Luminescence from an organic compound includes luminescence generated in returning to a ground state from a singlet excited state (fluorescence) and luminescence generated in returning to a ground state from a triplet excited state (phosphorescence). A light emitting device manufactured with a film formation device and a film formation method according to the present invention can be applied in the cases of using either luminescence.

In this specification, a first electrode is an anode or a cathode of a light-emitting element. A light-emitting element includes the first electrode, an organic compound containing layer over the first electrode, and a second electrode formed over the organic compound containing layer. The electrode that is to be formed first over a substrate is referred to as the first electrode, depending on the formation order.

The first electrode can be disposed in a manner such as stripe arrangement, delta arrangement, or mosaic arrangement.

Note that a light-emitting device in this specification refers to an image display device, a light-emitting device, or a light source (including a lighting system). In addition, the light-emitting device includes a module in which a connector, for example, an FPC (Flexible Printed Circuit), a TAB (Tape Automated Bonding) tape, or a TCP (Tape Carrier Package) is attached to a light-emitting device, a module in which a printed wiring board is provided at the end of a TAB tape or a TCP, or a module in which an IC (integrated circuit) is directly mounted on a light-emitting element by a COG (Chip On Glass) method Moreover, in the light-emitting device according to the present invention, a method for driving a screen display is not limited particularly, and a dot-sequential driving method, a line-sequential driving method, or a frame sequential driving method may be used, for example. The line-sequential driving method is typically employed, in which a time division gray scale driving method or an area gray scale driving method may be employed appropriately. In addition, a video signal to be inputted into a source line of the light-emitting device may be an analog signal or a digital signal, and a driver circuit and the like may be designed appropriately according to the video signal.

Further, light-emitting devices using digital video signals are classified into one in which video signals are inputted into a pixel at a constant voltage (CV), and one in which video signals are inputted into a pixel at a constant current (CC). The light-emitting devices in which video signals are inputted into a pixel at a constant voltage (CV) are further classified into one in which a constant voltage is applied to a light-emitting element (CVCV), and one in which a constant current is applied to a light-emitting element (CVCC). The light-emitting devices in which video signals are inputted into a pixel at a constant current (CC) is classified into one in which a constant voltage is applied to a light-emitting element (CCCV), and one in which a constant current is applied to a light-emitting element (CCCC).

Furthermore, a protection circuit (such as a protection diode) may be provided in the light-emitting device according to the present invention so as to prevent electrostatic discharge damage.

In addition, in the case of an active matrix type, although a plurality of TFTs connected to the first electrode is provided, the present invention can be applied regardless of a TFT structure. For example, a top gate TFT, a bottom gate (inversely staggered) TFT or a staggered TFT can be used. Further, the present invention is not limited to a TFT with a single gate structure; therefore, a TFT with a multi-gate structure having a plurality of channel forming regions, for example, a double gate TFT may be used.

Moreover, a light-emitting element may be electrically connected to either a p-channel TFT or an n-channel TFT. When the light-emitting element is connected to the p-channel TFT, the light-emitting element may be formed as follows. The p-channel TFT is connected to an anode and a hole injecting layer, a hole transporting layer, a light-emitting layer, and an electron transporting layer are sequentially stacked over the anode, and thereafter, a cathode is formed. When the light-emitting element is connected to the n-channel TFT, the light-emitting element may be formed as follows. The n-channel TFT is connected to a cathode and an electron transporting layer, a light-emitting layer, a hole transporting layer, and a hole injecting layer are sequentially stacked over the cathode, and thereafter, an anode is formed.

Further, an amorphous semiconductor film, a semiconductor film including a crystalline structure, a compound semiconductor film including an amorphous structure, or the like can be appropriately used as an active layer of the TFT. Furthermore, a semi-amorphous semiconductor film (also referred to as a microcrystalline semiconductor film) can also be used as an active layer of the TFT. The semi-amorphous semiconductor film has an intermediate structure between an amorphous structure and a crystal structure (also including a single crystal structure and a polycrystal structure), and a third condition that is stable in term of free energy, and further includes a crystalline region having a short-range order with lattice distortion.

In this specification, the pixel electrode is an electrode to be connected to a TFT and to make a pair with an opposite electrode provided for an opposite substrate. In addition, the liquid crystal element includes the pixel electrode, the opposite electrode and a liquid crystal layer interposed between these electrodes. In active matrix type liquid crystal display device, pixel electrodes arranged in matrix are driven to form a display pattern on a display screen. In other words, by applying a voltage between a selected pixel electrode and an opposite electrode corresponding to the selected pixel electrode, the liquid crystal layer disposed between the pixel electrode and the opposite electrode is optically modulated. This optical modulation is recognized as a display pattern by an observer.

According to the present invention, in a semiconductor device including a TFT and an ITO, it is possible to prevent a projection such as hillock or whisker from being generated even when pure aluminum is used as a wiring material, to prevent silicon and aluminum from diffusing into each other and to make an favorable ohmic contact with ITO. Further, such a superior wiring or electrode can be obtained and much lower power consumption of a semiconductor device can be realized.

DETAILED DESCRIPTION OF THE INVENTION

Embodiment Modes according to the present invention will hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes to be given below.

Embodiment Mode 1

In Embodiment Mode 1, the present invention is described with use of an example of an active matrix light-emitting device.

Figure 1:
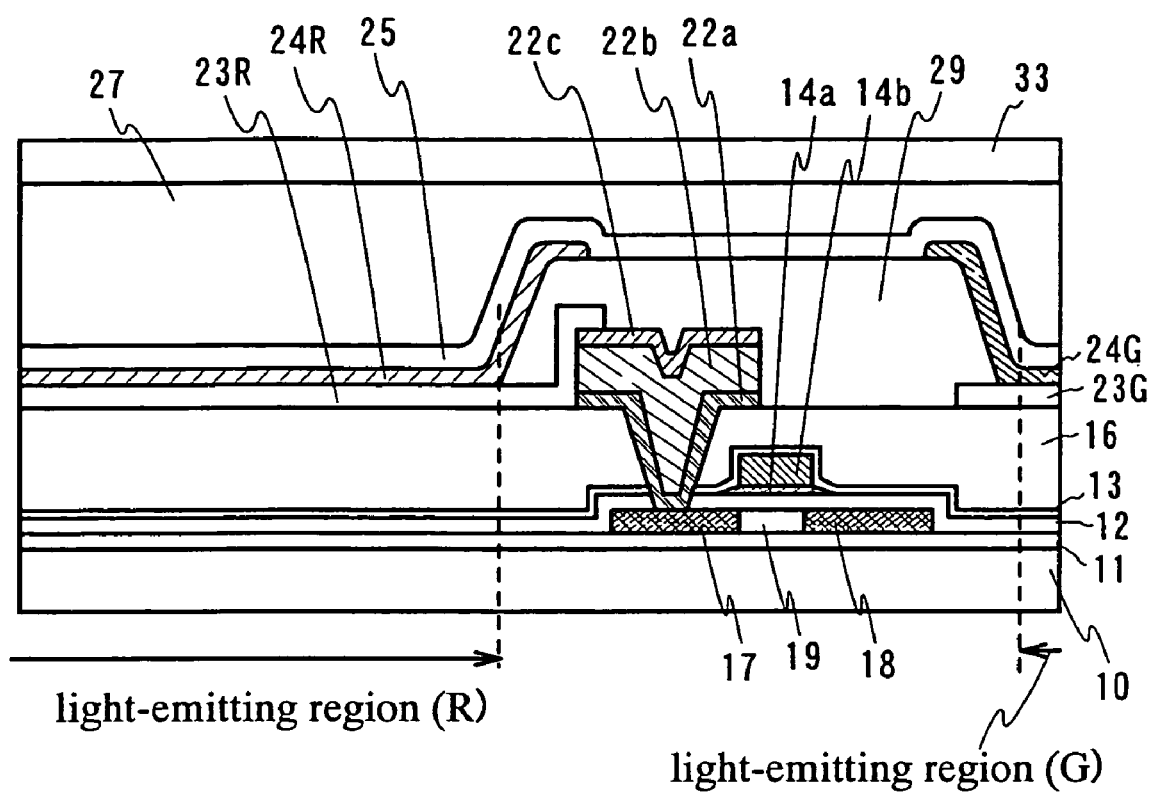
FIG. 1 is a cross sectional view showing Embodiment Mode 1.

FIG. 1 is a partially enlarged cross sectional view of a pixel portion in a light-emitting device. Hereinafter, a manufacturing process of a semiconductor device having a light-emitting element shown in FIG. 1 is described.

A base insulating film 11 is formed over a substrate 10. In the case where light is emitted through the substrate 10 to exhibit images on a display surface, the substrate 10 may be formed of a glass substrate or a quartz substrate that is light-transmitting. Further, a heat-resistant plastic substrate which is light-transmitting and which can withstand a processing temperature may be used. Alternatively, in the case where a surface opposite to the substrate 10 is used as a display surface to emit light therethrough, the substrate 10 may be formed of a silicon substrate, a metal substrate, or a stainless steel substrate having an insulating surface, besides the above-mentioned substrates. In the embodiment mode, a glass substrate is used as the substrate 10. The refractive index of the glass substrate is approximately 1.55.

As for the base insulating film 11, a base film made of an insulating film such as a silicon oxide film, a silicon nitride film, and a silicon oxynitride film is formed. This embodiment mode shows an example of the base film having a two-layer structure. In addition, the base film may be formed with a single layer of the insulating film or a stacked structure of two or more insulating films. Note that the base insulating film may not particularly be provided.

Then, a semiconductor layer is formed over the base insulting film. The semiconductor layer is formed as follows. A semiconductor film having an amorphous structure is formed by a known method (such as sputtering, LPCVD or plasma CVD). The amorphous semiconductor is subjected to a known crystallization treatment (for example, laser crystallization, thermal crystallization, thermal crystallization using a catalyst such as nickel) to form a crystalline semiconductor film. The crystalline semiconductor film is patterned into a predetermined shape using a first photomask, thereby forming the semiconductor layer. The thickness of the semiconductor layer is set 25 to 80 nm (preferably, 30 to 70 nm).

Although the material for the crystalline semiconductor film is not particularly limited, it is preferable that the crystalline semiconductor film may be formed of silicon or a silicon germanium (SiGe) alloy.

A continuous wave laser may be used for the crystallization treatment of the semiconductor film having the amorphous structure. In the crystallization of the amorphous semiconductor film, in order to obtain a crystal with large grain size, it is preferable to use a solid-state continuous wave laser and use second to fourth harmonics of a fundamental wave. Typically, a second harmonic (532 nm) or a third harmonic (355 nm) of an Nd:YVO$^4$ laser (fundamental wave: 1064 nm) is preferably employed. When the continuous wave laser is used, laser light emitted from a continuous wave YVO$_4$ laser with output power of 10 W is converted into a harmonic by a non-linear optical element. Further, a YVO$_4$ crystal and a non-linear optical element may be put in a resonator to emit a harmonic. Then, the laser light is formed into a rectangular shape or an elliptic shape on an irradiation surface by an optical system so as to irradiate an object therewith. At this moment, the power density of approximately 0.01 to 100 MW/cm$^2$ (preferably, from 0.1 to 10 MW/cm$^2$) is required. The laser beam may be emitted onto the semiconductor film while moving the semiconductor film relatively to the laser light at a rate of about 10 to 2,000 cm/s.

After removing the resist mask, a gate insulating film 12 is formed to cover the semiconductor layer. The gate insulating film 12 is formed to have a film thickness of 1 to 200 nm by plasma CVD or sputtering. Preferably, the gate insulating film 12 is thinly formed to have a thickness of 10 to 50 nm using an insulating film containing silicon as a single layer or a stacked layer. Then, the surface of the gate insulating film is nitrided using microwave plasma.

When the insulating film having thin film thickness is formed by plasma CVD, the rate of film formation is necessary to be reduced so as to control the thin film thickness of the insulating film, precisely. For example, the rate of forming a silicon oxide film can be set to 6 nm/min under the conditions of the RF (10 kHz) electric power of 100 W; a pressure of 0.3 Torr; an N$_2$O gas flow rate of 400 sccm; and a SiH$_4$ gas flow rate of 1 sccm. The nitriding treatment using microwave plasma is carried out using a microwave power source (2.45 GHz) and a nitrogen gas as a reactive gas.

The concentration of nitrogen is gradually reduced from a top surface of the gate insulating film 12 to a bottom surface thereof. In this manner, not only nitriding the surface of the silicon oxide film in high concentration, but also reducing nitrogen at an interface between the silicon oxide film and an active layer can be realized, thereby preventing deterioration of the device characteristics.

Next, a conductive film is formed to have a thickness of 100 to 600 nm over the gate insulating film 12. A conductive film obtained by stacking a TaN film and a W film is formed by sputtering here. Although the conductive film is a stacked layer of the TaN film and the W film, the structure of the conductive film is not particularly limited thereto. Alternatively, the conductive film may be formed of a single layer or a stacked layer of an element selected from Ta, W, Ti, Mo, Al, and Cu, or an alloy material or a compound material including the elements as its main component. Furthermore, a semiconductor film typified by a polycrystalline silicon film doped with an impurity element such as phosphorus may also be used.

A resist mask is formed using a second photomask to etch the conductive film by dry etching or wet etching. In this etching step, the conductive film is etched to form conductive layers 14a, 14b. The conductive layers 14a, 14b serve as gate electrodes of the TFT.

After removing the resist mask, another resist mask is anew formed using a third photomask. In order to form an n-channel TFT (not shown), a first doping step is carried out so as to add an impurity element (typically, phosphorus or As) imparting n-type conductivity into the semiconductor layer to form a low concentration impurity region. A region to be a p-channel TFT and the vicinity of the conductive layer are covered with the resist mask. In the first doping step, the semiconductor layer is doped through the insulating film to form a low concentration impurity region. In this embodiment mode, one light emitting element is driven by a plurality of TFTs. However, when it is driven by only a p-channel TFT, the above-mentioned doping step is not particularly required.

After removing the resist mask, another resist mask is anew formed using a fourth photomask to carry out a second doping step for doping an impurity element (typically, boron) imparting p-type conductivity into the semiconductor layer to form high concentration impurity regions. In the second doping step, the semiconductor layer is doped though the gate insulating film 12 to form p-type high concentration impurity regions 17 and 18.

After removing the resist mask, another resist mask is anew formed using a fifth photomask. In order to form an n-channel TFT (not shown), a third doping step is carried out to add an impurity element (typically, phosphorus or As) imparting n-type conductivity into the semiconductor layer to form a high concentration impurity region. The conditions of ion doping in the third doping step are as follows: the dosage is set in the range of from $1 \times 10^{13}$ to $5 \times 10^{15}/cm^2$; and an acceleration voltage is set in the range of from 60 to 100 keV. The resist mask covers a region to be a p-channel TFT and the vicinity of the conductive layer. In the third doping step, the semiconductor layer is doped through the gate insulating film 12 so as to form an n-type high concentration impurity region.

Thereafter, the resist mask is removed. After forming a first interlayer insulating film 13 containing hydrogen, the impurity elements added to the semiconductor layer are activated and hydrogenated. As for the first interlayer insulating film 13 containing hydrogen, a silicon nitride oxide film (SiNO film) formed by plasma CVD is employed. Further, when the semiconductor layer is crystallized by using a metal element for promoting crystallization such as nickel, gettering can be performed to reduce the concentration of nickel contained in a channel forming region 19 at the time of the activation.

A planarizing insulating film 16, which will be a second layer of the interlayer insulating film, is formed. The planarizing insulating film 16 is formed of an insulating film such as siloxane having a skeleton structure including a bond of silicon (Si) and oxygen (O), which is obtained by a coating method.

Contact holes are formed in the planarizing insulating film 16 by etching with use of a sixth mask and the planarizing insulating film 16 in the peripheral portion is removed simultaneously. The etching (wet etching or dry etching) is conducted under a condition of a selected ratio with respect to the first interlayer insulating film 13. Although an etching gas used in the etching is not particularly limited, $CF_4$, $O_2$, He, and Ar are preferably used in this step. Here, dry etching is conducted under the conditions of the $CF_4$ flow rate of 380 sccm; the $O_2$ flow rate of 290 sccm; the He flow rate of 500 sccm; the Ar flow rate of 500 sccm; the RF power of 3,000 W; and a pressure of 25 Pa. In order to etch the planarizing insulating film without leaving residue on the interlayer insulating film 13, etching time may be increased by about 10 to 20%. The planarizing insulating film may be formed to have a tapered shape by one etching treatment or by a plurality of etching treatments. In the embodiment mode, the second dry etching is conducted under the conditions of the $CF_4$ flow rate of 550 sccm; the $O_2$ flow rate of 450 sccm; the He flow rate of 350 sccm; the RF power of 3,000 W, and a pressure of 25 Pa so as to form a tapered shape. The taper angle θ of the edge portion in the planarizing insulating film is desirably set more than 30° and less than 75°.

Subsequently, etching is further performed using the sixth mask, which has not been removed, to selectively remove the exposed gate insulating film 12 and first interlayer insulating film 13. The gate insulating film 12 and the first interlayer insulating film 13 are etched by using $CHF_3$ and Ar as an etching gas. In order to etch the insulating films without leaving residue on the semiconductor layer, it is preferable that etching time is increased by about 10 to 20%.

Thereafter, the sixth mask is removed and a conductive film having a three-layer structure is formed to be in contact with the semiconductor layer in the contact hole. The three layers are preferably formed continuously in the same sputtering apparatus so as not to oxidize the surface of each layer. Then, etching is conducted using a seventh mask to form a wiring or an electrode.

The first conductive layer 22a for preventing silicon and aluminum from diffusing into each other is formed from pure titanium (Ti) or pure molybdenum (Mo) to be 20 to 200 nm thick.

The second conductive layer 22b for lowering electric resistance of a wiring is formed from pure aluminum to be 0.1 to 2 μm.

The third conductive layer 22c of an aluminum alloy that does not react with ITO is formed using an aluminum alloy film containing Ti (titanium), Mo (molybdenum) or C (carbon). The third conductive layer 22c is 5 to 200 nm thick.

Figure 2:
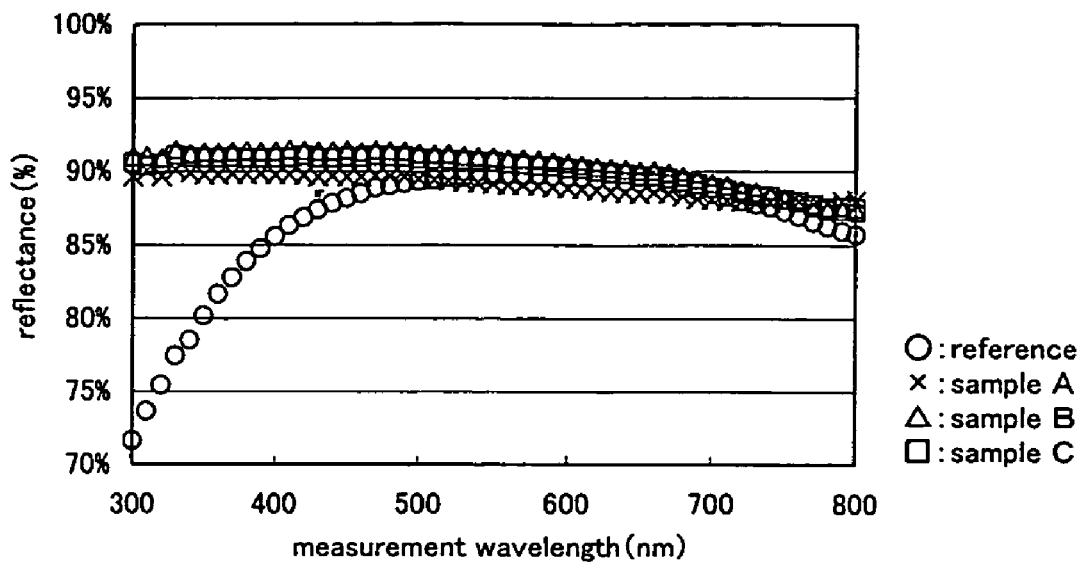
FIG. 2 shows a reflectance after forming films.

FIG. 2 shows data of reflectance of an aluminum alloy film containing Ti (titanium) or C (carbon), which is formed by sputtering to be 200 nm thick. In FIG. 2, the vertical axis shows reflectance (%) and the horizontal axis shows a measurement wavelength (nm). An aluminum film formed using pure aluminum as a target is used as a comparative example. The sample A is an aluminum carbon alloy film including Ti that is formed by setting a Ti pellet (the area is 0.5 cm$^2$) and a C pellet (the area is 0.5 cm$^2$) on pure aluminum target (+6 inches). When the sample is measured with ESCA, Ti of 2.7 atoms % and C of 1 atoms % or less are contained in the Al film.

The sample B is an aluminum carbon alloy film that is formed by setting a C pellet (the area is 0.5 cm$^2$) on a pure aluminum target. The sample C is an aluminum carbon alloy film that is formed by setting a C pellet (the area is 1 cm$^2$) on a pure aluminum target.

As apparent from FIG. 2, the aluminum carbon alloy film including Ti and the aluminum carbon alloy films are high in reflectance in a short wavelength region and superior in planarity.

The samples are baked at 300° C. and then the reflectance thereof are each measured again. The obtained data is shown in FIG. 3.

Figure 3:
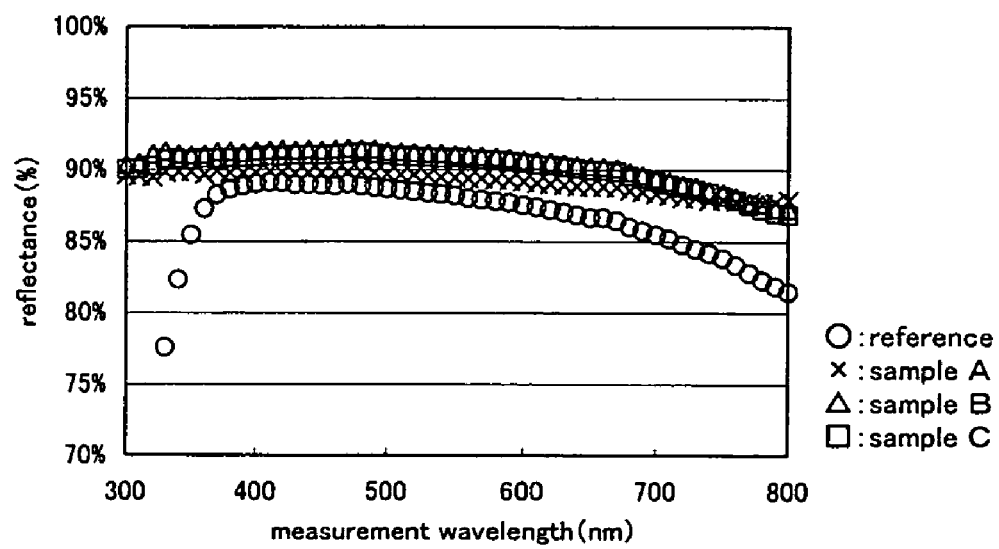
FIG. 3 shows a reflectance after baking.

FIG. 3 shows that the reflectance of the aluminum film (comparative example) is changed by the baking of 300° C.; on the contrary, the reflectance of the aluminum carbon alloy film including Ti and aluminum carbon alloy film are nearly unchanged. In other words, it can be thought that the reflectance of the aluminum film (comparative example) is lowered because hillock or an oxide film is formed on the surface thereof by baking. As the result thereof, it can be said that hillock or an oxide film is difficult to be formed on the aluminum carbon alloy film including Ti and aluminum carbon alloy films.

The reflectance (μΩcm) of the samples are each measured before and after baking. Table 1 shows the measured result before baking. Table 2 shows the measured result after baking.

TABLE 1

| | | | as-depo | | | | | | | | |
|---|---|---|---|---|---|---|---|---|---|---|---|
| | area(cm2) | | Sheet Resistance[Ω/□] | | | | | average | thickness | resistance | DELTA |
| No. | Ti | C | 1 | 2 | 3 | 4 | 5 | [Ω/□] | [Å] | [μΩcm] | [%] |
| reference | 0 | 0 | 231.48 | 229.34 | 258.78 | 260.49 | 228.74 | 241.766 | 2000 | 4.83532 | 13.13253 |
| sampleA | 0.5 | 0.5 | 0.7476 | 0.6974 | 0.7054 | 0.801 | 0.8207 | 0.75442 | 1682.528 | 12.6933308 | 16.34368 |
| sampleB | 0 | 0.5 | 322.87 | 316.92 | 321.23 | 343.69 | 346.25 | 330.192 | 1613.895 | 5.32895284 | 8.882711 |
| sampleC | 0 | 1 | 289.23 | 295.57 | 305.31 | 305.11 | 302.81 | 299.606 | 2097 | 6.28398178 | 5.367049 |

TABLE 2

| | | | after baking (300° C.) | | | | | | | | |
|---|---|---|---|---|---|---|---|---|---|---|---|
| | area(cm2) | | Sheet Resistance[Ω/□] | | | | | average | thickness | resistance | DELTA |
| No. | Ti | C | 1 | 2 | 3 | 4 | 5 | [Ω/□] | [Å] | [μΩcm] | [%] |
| reference | 0 | 0 | 216.26 | 214.01 | 214.3 | 242.73 | 248.88 | 227.236 | 2000 | 4.54472 | 15.34528 |
| sampleA | 0.5 | 0.5 | 0.551 | 0.531 | 0.6038 | 0.6002 | 0.5296 | 0.56312 | 1682.528 | 9.47465393 | 13.17659 |
| sampleB | 0 | 0.5 | 262.9 | 261.06 | 281.45 | 281.79 | 266.55 | 270.75 | 1613.895 | 4.36962125 | 7.65651 |
| sampleC | 0 | 1 | 220.57 | 222.95 | 234.9 | 230.61 | 225.59 | 226.924 | 2097 | 4.75953847 | 6.31489 |

As to the aluminum film (comparative example), the resistance before baking is 4.8 (μΩcm) as shown in Table 1, and the resistance after baking is 4.5 (μΩcm) as shown in Table 2. As to the sample A, the resistance before baking is 12.7 (μΩcm) as shown in Table 1, and the resistance after baking is 9.5 (μΩcm) as shown in Table 2. As the sample B, the resistance before baking is 5.3 (μΩcm) as shown in Table 1, and the resistance after baking is 4.3 (μΩcm) as shown in Table 2. As to the sample C, the resistance before baking is 6.3 (μΩcm) as shown in Table 1, and the resistance after baking is 4.8 (μΩcm) as shown in Table 2.

A transparent conductive film is formed to be in contact with the wiring or electrode having a three-layer structure. If the transparent conductive film is formed to be directly in contact with the third conductive layer 22c, a favorable ohmic contact can be obtained. Then, etching is conducted using an eighth mask to form first electrodes 23R and 23G, that is, an anode (or cathode) of an organic light-emitting element.

ITO (indium tin oxide) or ITSO (indium tin oxide containing silicon oxide formed by sputtering using a target made of ITO containing silicon oxide of 2 to 10% by weight) is used as a material of the first electrode. A transparent conductive film such as a light-transmitting conductive oxide film (IZO) including silicon oxide in which 2 to 20% zinc oxide (ZnO) is mixed into indium oxide may also be used, besides ITSO. In addition, a transparent conductive film of antimony tin oxide (ATO) including silicon oxide may also be used.

When ITO is used for the first electrodes 23R and 23G, baking for crystallization is conducted to lower electric resistance. On the contrary, ITSO or IZO is kept in an amorphous state even when it is baked, unlike ITO.

An insulator 29 (such as bank, partition wall, barrier or mound) is formed to cover edge portions of the first electrodes 23R and 23G using the eighth mask. As the insulator 29, an organic resin film formed by a coating method or an SOG film (e.g., an SiOx film containing an alkyl group) is formed to be 0.8 to 1 μm thick.

Hereinafter, organic compound containing layers 24R and 24G are formed thereover by an evaporation method or a coating method. Note that deaeration is preferably conducted by vacuum heating before forming the organic compound containing layers 24R and 24G in order to enhance the reliability. For example, a heat treatment of 200 to 300° C. is desirably conducted in a low pressure atmosphere or an inert atmosphere in order to remove a gas included in a substrate before depositing an organic compound material. An evaporation method is employed to form the organic compound containing layers 24R and 24G and the deposition thereof is conducted in a film formation chamber that is evacuated so that the vacuum degree is $5 \times 10^{-3}$ Torr (0.665 Pa) or less, preferably $10^{-4}$ to $10^{-6}$ Torr. The organic compound is vaporized in advance by resistance heating in the evaporation, and is scattered toward a substrate by opening a shutter at the time of the evaporation. The vaporized organic compound is scattered upward, and passes through an opening portion formed in a metal mask to be deposited on the substrate.

Masks for each color (R, G, B) are aligned to obtain full-color display.

The organic compound containing layers 24R and 24G each have a stacked structure, in which a hole injecting layer, a hole transporting layer, a light-emitting layer, an electron transporting layer are stacked over the first electrode in this order. For example, in the organic compound containing layer 24R, $Alq_3$ into which DCM is added is formed to be 40 nm thick as the light-emitting layer. In addition, in the organic compound containing layer 24G, $Alq_3$ into which DMQD is added is formed to be 40 nm thick as the light-emitting layer. In addition, although not shown here, as a light-emitting layer for a blue color, PPD (4,4'-bis(N-(9-phenanthryl)-N-phenylamino) biphenyl) doped with CBP (4,4'-bis(N-carbazolyl)-biphenyl) is deposited to be 30 nm in thickness, and SAlq (bis(2-methyl-8-quinolinolato)(triphenylsilanolato)aluminum) is deposited to be 10 nm in thickness as a blocking layer.

Next, a second electrode 25, that is, a cathode (or an anode) of an organic light-emitting element is formed. As a material for the second electrode 25, an alloy such as MgAg, MgIn, AlLi, CaF$_2$, or CaN, or a film formed by co-evaporation of an element belonging to Group 1 or 2 of the periodic table and aluminum may be used.

Before forming the second electrode 25, a light-transmitting layer (1 to 5 nm in film thickness) including CaF$_2$, MgF$_2$, or BaF$_2$ may be formed as a cathode buffer layer.

In addition, a protective layer for protecting the second electrode 25 may be formed.

Next, a sealing substrate 33 is attached by a sealing agent (not shown) to encapsulate the light-emitting element. A region 27 surrounded by the sealing agent and a pair of the substrates is filled with a dried inert gas or a transparent filler. A rare gas element or nitrogen can be used as the inert gas, and a drying agent for drying is arranged in the sealing substrate 33. In addition, the filler is not particularly limited as long as it is a light-transmitting material. Typically, an ultraviolet curing or thermosetting epoxy resin may be used. By filling the space between the pair of substrates with the filler, the total transmittance can be improved.

When the first and second electrodes are formed from a transparent material and a metal material, respectively, a structure in which light can pass through the substrate 10, namely, a bottom emission structure can be obtained. In addition, when the first and second electrodes are formed from a metal material and a transparent material, respectively, a structure in which light can pass through the sealing substrate 33, namely, a top emission structure can be obtained. When the first and second electrodes are each formed from a transparent material, a structure in which light can pass through both of the substrate 10 and the sealing substrate 33, namely, a dual emission structure can be obtained. The present invention may employ one of the structures appropriately.

When light is emitted through the substrate 10, silicon oxide (the refractive index of about 1.46) is contained in each layer through which light emitted from a light emitting layer passes, i.e., the first electrode; the first interlayer insulating film 13; the planarizing insulating film 16 as the second interlayer insulating film; the gate insulating film 12; and the base insulating film 11. Therefore, the difference in the refractive indexes between the films is lessened, which increases the light-extraction efficiency. Namely, generation of stray light can be suppressed between the material layers having different refractive indexes.

Embodiment Mode 2

An example of forming a transparent conductive film and an electrode having a three-layer structure in an order different from that of Embodiment Mode 1 is described with reference to FIG. 4.

The process up to forming the planarizing insulating film 16 is similar to that of Embodiment Mode 1, and thus detailed description thereof is omitted. In addition, the same portions as those in FIG. 1 are shown in FIG. 4 by the same reference numerals as those in FIG. 1.

According to the process of Embodiment Mode 1, the planarizing insulating film 16 is formed. Then, a transparent conductive film is formed and patterned to form first electrodes 423R and 423G.

After that, the planarizing insulating film 16 is selectively etched to form a contact hole that reaches a p-type high-concentration impurity region 17. A molybdenum metal film is formed to be in contact with the first electrode and the p-type high-concentration impurity region 17. Then, an aluminum film and an aluminum alloy film are continuously formed to be stacked. Patterning is conducted thereto to form first, second and third conductive layers 422a, 422b and 422c.

The first conductive layer 422a is formed from pure molybdenum (Mo) to be 20 to 200 nm thick so as to prevent silicon and aluminum from diffusing into each other.

The second conductive layer 422b is formed from pure aluminum to be 0.1 to 2 μm so as to lower the electric resistance of a wiring.

The third conductive layer 422c formed from an aluminum alloy is an aluminum alloy film containing Ti (titanium) or C (carbon). The thickness of the third conductive layer 422c ranges from 5 to 200 nm.

When the electrode having the three-layer structure is patterned, plural types of etching methods are employed. The conductive layers 422c, 422b are selectively removed by dry etching and then the conductive layer 422a is removed by wet etching. The first electrode is not damaged and the surface thereof can be cleaned by employing the wet etching.

Thereafter, an insulator 29 covering edge portions of the first electrodes 423R and 423G is formed in the same manner as in Embodiment Mode 1. The following process is similar to that in Embodiment Mode 1, and thus detailed description thereof is omitted.

Figure 4:
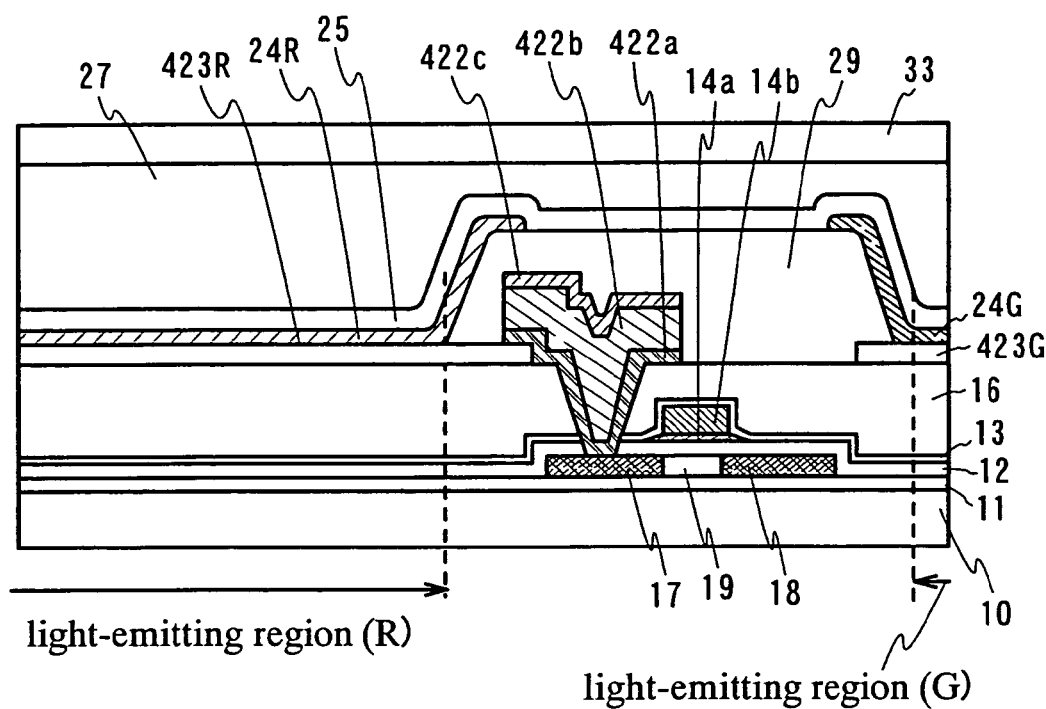
FIG. 4 is a cross sectional view showing Embodiment Mode 2.

By employing the structure shown in FIG. 4, the first conductive layer 422a is in contact with the p-type high concentration impurity region 17 and also with the transparent conductive film to obtain a favorable ohmic contact.

This embodiment mode can be freely combined with Embodiment Mode 1.

Embodiment Mode 3

An example of forming an insulating film between a transparent conductive film and an electrode having a three-layer structure is described hereinafter with reference to FIG. 5.

The process up to forming an electrode including first, second and third conductive layers 22a, 22b, 22c is similar to that in Embodiment Mode 1 and thus, detailed description is omitted. In addition, the same portions as those in FIG. 1 are shown in FIG. 5 by the same reference numerals as those in FIG. 1.

According to the process shown in Embodiment Mode 1, an electrode having a three-layer structure is formed. Thereafter, a planarizing insulating film 520 to become a third interlayer insulating film is formed. An insulating film such as siloxane having a skeleton structure of silicon (Si) and oxygen (O) formed by a coating method is used as the planarizing insulating film 520. Here, the planarizing insulating film 16 itself is not required to be flat, because the planarizing insulating film 520 as the third interlayer insulating layer is planarized. Thus, an inorganic insulating film formed by a PCVD method may be employed as the planarizing insulating film 16.

The planarizing insulating film 520 is selectively etched to form a contact hole that reaches the third conductive layer 22c. Thereafter, a transparent conductive film is formed and patterned to form first electrodes 523R and 523G.

Then, an insulator 529 covering edge portions of the first electrodes 523R and 523G is formed in the same manner as in Embodiment Mode 1. After that, organic compound containing layers 524R and 524G are stacked thereover by an evaporation method or a coating method. The following process is similar to that in Embodiment Mode 1, and thus detailed description thereof is omitted. According to Embodiment Mode 1, a second electrode 525 is formed and a sealing substrate 533 is attached by a sealing agent so as to encapsulate the light-emitting element. Further, a region 527 surrounded by a pair of substrates and the sealing agent is filled with a dried inert gas or a transparent filler.

Figure 5:
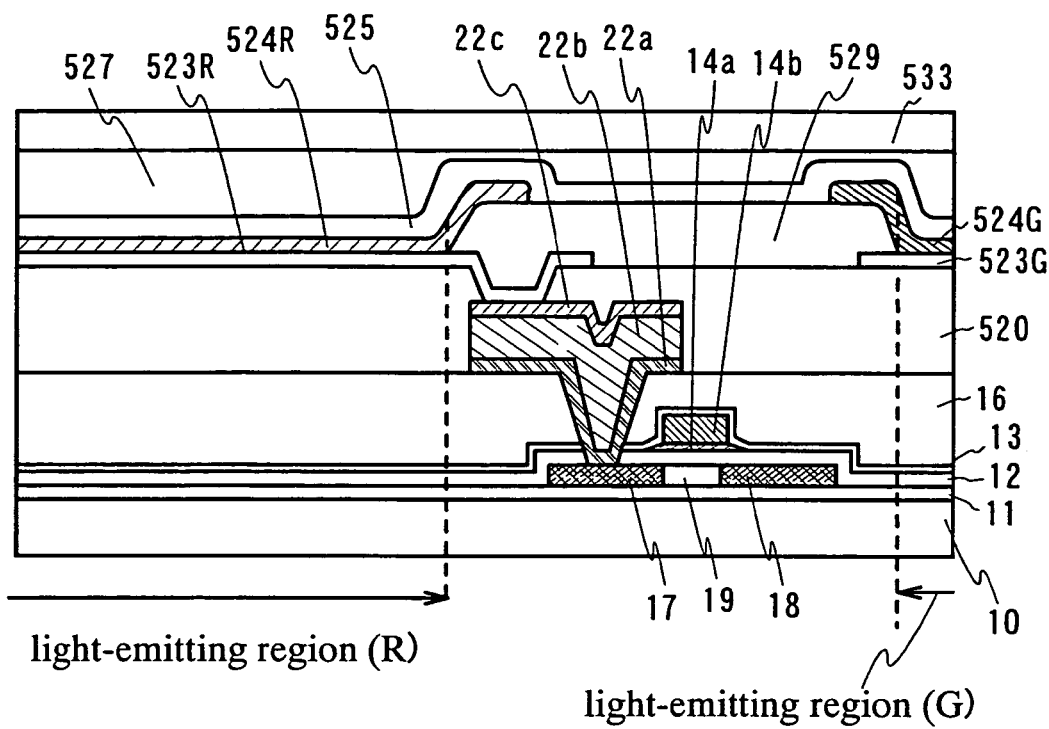
FIG. 5 is a cross sectional view showing Embodiment Mode 3.

The area of the first electrode can be more enlarged than that of Embodiment Mode 1 and thus the area for emitting light can also be enlarged by employing the structure shown in FIG. 5.

This embodiment mode can be freely combined with Embodiment Mode 1.

The present invention including the above described structures is described more in detail with reference to Embodiments below.

Embodiment 1

Figure 6:
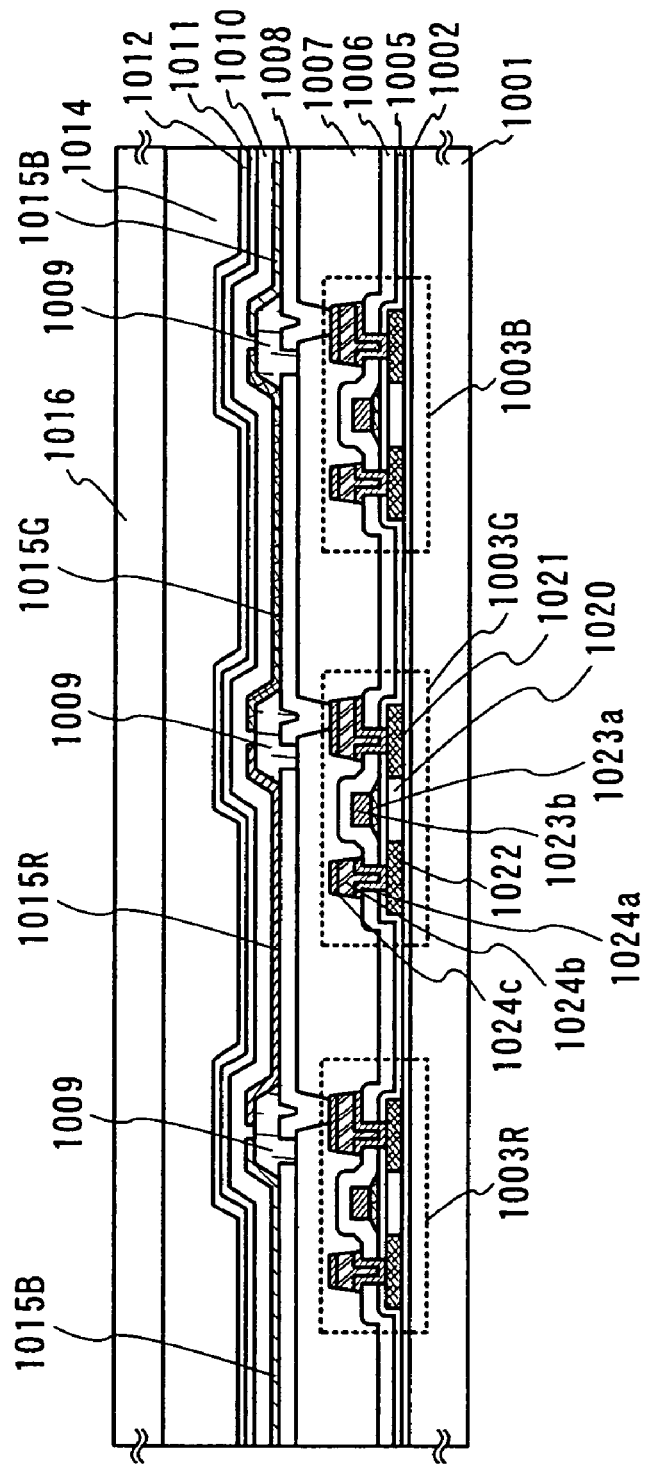
FIG. 6 is a cross sectional view of an EL display panel.

In Embodiment 1, a full-color light-emitting device is described with reference to FIG. 6. FIG. 6 is a cross sectional view partially showing an active-matrix light emitting device.

A base insulating film 1002 is formed over a first substrate 1001. Three TFTs 1003R, 1003G, and 1003B are disposed thereover. The TFTs are p-channel TFTs each having a channel forming region 1020 and source and drain regions 1021 and 1022 as active layers; and having a gate insulating layer 1005; and a gate electrode 1023a and 1023b. The gate electrode has a two-layer structure including the bottom layer 1023a that has a tapered shape, and the top layer 1023b.

An interlayer insulating film 1006 is an inorganic insulating film formed by a PCVD method. A planarizing insulating film 1007 is a flat interlayer insulating film formed by a coating method.

In the light-emitting element, it is important that the first electrode is flat. Thus, if the planarizing insulating film 1007 is not flat, there is a possibility that the first electrode is not flat either due to the surface unevenness of the planarizing insulating film 1007. Therefore, the planarity of the planarizing insulating film 1007 is important.

Further, a drain or source wiring of a TFT has a three-layer structure, 1024a, 1024b and 1024c. Here, a stacked film of a Ti film, a pure aluminum film and an aluminum carbon alloy film including Ti is used. The drain or source wiring of the TFT preferably has a tapered shape in consideration of the coverage of the interlayer insulating film.

A bank 1009 is a resin and serves as a partition with an organic compound containing layers emitting different color. Therefore, the bank 1009 has a grid-like shape to surround one pixel, in other words, the light-emitting region. In addition, the organic compound containing layers emitting different color may be overlapped over the bank but not overlapped with the first electrode in neighboring pixels.

A red light-emitting element includes a first electrode 1008 formed from a transparent conductive material, a layer containing an organic compound 1015R, and a second electrode 1010. A blue light-emitting element includes the first electrode 1008 formed from a transparent conductive material, a layer containing an organic compound 1015B, and the second electrode 1010. In addition, a green light-emitting element includes the first electrode 1008 formed from a transparent conductive material, a layer containing an organic compound 1015G, and the second electrode 1010.

Further, the materials for the first electrode 1008 and the second electrode 1010 is preferable to be selected in consideration of a work function. However, the first electrode 1008 and the second electrode 1010 can each be an anode or a cathode depending on a pixel structure. When a polarity of a driving TFT is a p-channel type, it is preferable that the first electrode 1008 serves as an anode and the second electrode 1010 serves as a cathode. When a polarity of the driving TFT is an n-channel type, it is preferable that the first electrode 1008 serves as a cathode and the second electrode 1010 serves as an anode.

An HIL (hole injecting layer), an HTL (hole transporting layer), an EML (light-emitting layer), an ETL (electron transporting layer), and an EIL (electron injecting layer) are sequentially stacked on the first electrode 1008 (anode) side in the layers containing an organic compound 1015R, 1015G, and 1015B. A single layer structure or a mixed structure other than the stacked structure can be employed for the layers containing an organic compound 1015B, 1015R and 1015G. In order to obtain the full-color light-emitting device, the layers containing an organic compound 1015R, 1015G, and 1015B each are selectively formed to form three kinds pixels of R, G, and B.

Furthermore, in order to protect the light-emitting elements from damage due to water or degassing, it is preferable to provide protective films 1011 and 1012 covering the second electrode 1010. The protective films 1011 and 1012 are preferably formed using a dense inorganic insulating film (such as an SiN film or an SiNO film) formed by a PCVD method, a dense inorganic insulating film (such as an SiN film or an SiNO film) formed by a sputtering method, a thin film containing carbon as the main component (such as a DLC film, a CN film or an amorphous carbon film), a metal oxide film (such as $WO_2$, $CaF_2$ or $Al_2O_3$), or the like.

A filler or an inert gas is used to fill a space 1014 between the first substrate 1001 and a second substrate 1016. When an inert gas such as nitrogen is used to fill it, a drying agent for drying is preferably provided in the space 1014.

In addition, light of the light-emitting elements is extracted through the substrate 1001. The structure shown in FIG. 6 is a bottom emission light-emitting device.

Although a top gate TFT is exemplified here, the present invention can be applied regardless of a TFT structure. The present invention can be applied, for example, to a bottom gate (inversely staggered) TFT or a staggered TFT.

This embodiment can be freely combined with Embodiment Mode 1, 2, or 3.

Embodiment 2

Figure 7:
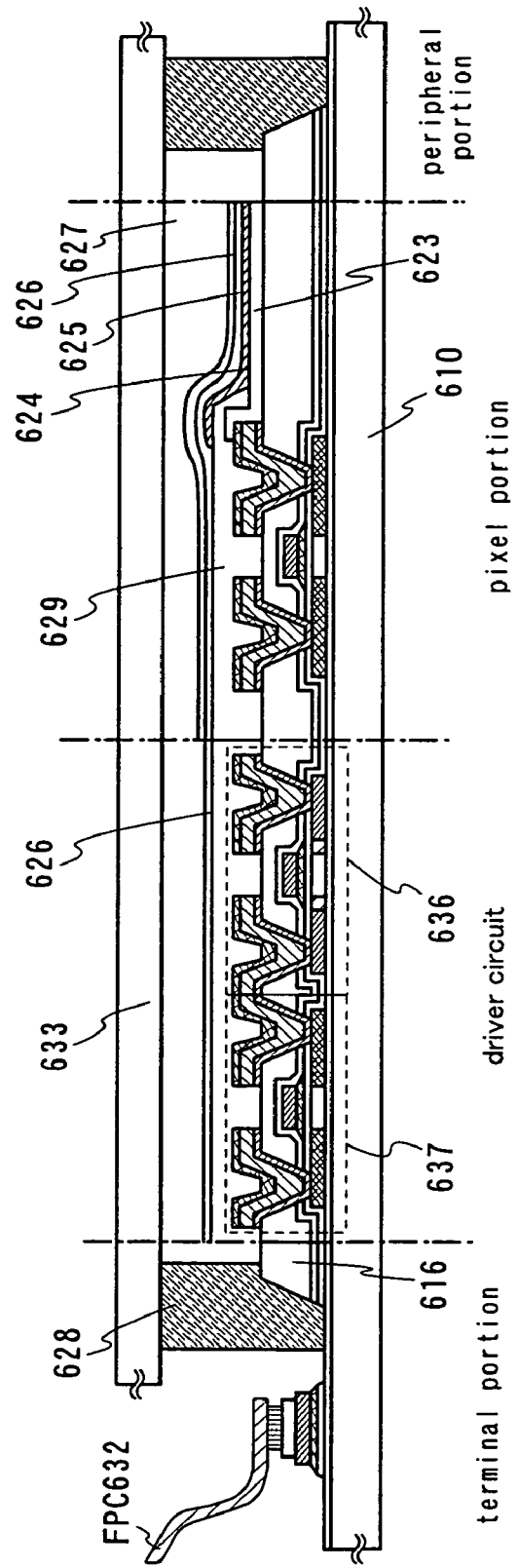
FIG. 7 is a cross sectional view of an EL display panel.

Embodiment 2 describes an example of a light-emitting device in which a pixel portion, a driver circuit and a terminal portion are integrated on one substrate and light can be extracted from the opposite substrates with reference to FIG. 7.

After forming a base insulating film on a substrate 610, each semiconductor layer is formed. Then, after forming a gate insulating film to cover the semiconductor layers, each gate electrode and a terminal electrode are formed. Then, in order to form an n-channel TFT 636, an impurity element (typically, phosphorus or arsenic) that imparts n-type conductivity is added into a semiconductor, and in order to form a p-channel TFT 637, an impurity element (typically, boron) that imparts p-type conductivity is added into the semiconductor to form a source region and a drain region, and also an LDD region appropriately, if necessary. Then, after forming a silicon nitride oxide (SiNO) film containing hydrogen obtained by a PCVD method, activation of the impurity element added into the semiconductor layer and hydrogenation are conducted.

Next, a planarizing insulating film 616 serving as an interlayer insulating film is formed. As the planarizing insulating film 616, an insulating film such as siloxane having a skeleton structure having a bond of silicon (Si) and oxygen (O), which can be obtained by a coating method, is used.

Next, with the use of a mask, a peripheral portion of the planarizing insulating film is removed at the same time as forming contact holes in the planarizing insulating film.

Next, etching is performed using the planarizing insulating film 616 as a mask to remove an exposed portion of a SiNO film including hydrogen or the gate insulating film selectively.

Next, after forming a conductive film, etching is performed with the use of a mask to form drain wirings and source wirings.

Next, a first electrode 623, that is, an anode (or a cathode) of an organic light-emitting element is formed.

Subsequently, an SOG film obtained by a coating method (e.g., a SiOx film including an alkyl group) is patterned to form an insulator 629 (referred to as bank, partition wall, barrier, mound, or the like) covering an edge portion of the first electrode 623.

Next, a layer containing an organic compound 624 is formed by an evaporation method or a coating method. Thereafter, a second electrode 625 made of a transparent conductive film, that is, a cathode (or an anode) of the organic light emitting element is formed. Then, a transparent protective layer 626 is formed by an evaporation method or a sputtering method. The transparent protective layer 626 protects the second electrode 625.

Subsequently, the light emitting element is sealed by attaching a transparent sealing substrate 633 by a sealing agent 628. In a light emitting display device, a circumference of a display portion is surrounded by the sealing agent and sealed with a pair of substrates. However, the interlayer insulating film of the TFT is provided over the entire surface of the substrate. Therefore, when a pattern of the sealing agent is drawn inside the circumference edge of the interlayer insulating film, there is a possibility that water or an impurity might enter from a part of the interlayer insulating film which is located outside the pattern of the sealing agent. Consequently, the sealing agent covers the edge portion of the planarizing insulating film such that the circumference of the planarizing insulating film used as the interlayer insulating film of the TFTs is positioned inside of the pattern of the sealing agent, preferably is overlapped with the pattern of the sealing agent. Note that the region surrounded by the sealing agent 628 is filled with a transparent filler 627.

Lastly, an FPC 632 is attached to the terminal electrode with an anisotropic conductive film 631 by a known method. A transparent conductive film is preferably used as the terminal electrode. The terminal electrode is formed over an electrode formed simultaneously with a gate wiring (FIG. 7).

Light generated in the light-emitting element is extracted from the opposite sides, in other words, through the substrate 610 and the sealing substrate 633. The structure shown in FIG. 7 is a light-emitting device having a structure in which light extracted from the both of substrate and sealing substrate.

According to the above described process, the pixel portion, the driver circuit and the terminal portion can be integrated on the same substrate.

This embodiment can be freely combined with Embodiment Mode 1, 2, or 3.

Embodiment 3

An example of mounting an FPC or a driver IC on an EL display panel manufactured according to the above described embodiments is described in Embodiment 3.

Figure 8A:
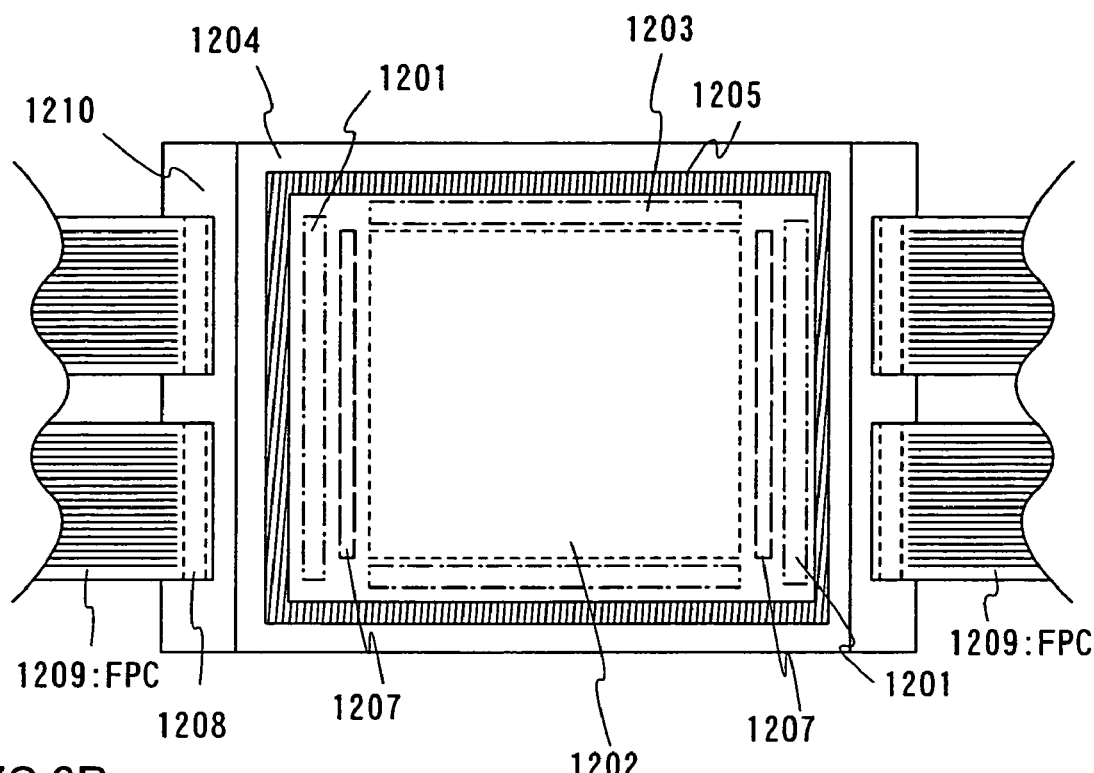
FIGS. 8A and 8B are each a top view of an EL display panel.

FIG. 8A is a top view of a light-emitting device in which FPCs 1209 are attached to four terminal portions 1208 as an example. A pixel portion 1202 including a light-emitting element and a TFT, a gate-side driver circuit 1203 including a TFT, and a source-side driver circuit 1201 including a TFT are formed over a substrate 1210. These circuits can be formed over one substrate when active layers of TFTs each are formed from a semiconductor film having a crystalline structure. Therefore, an EL display panel in which the system-on-panel is realized can be manufactured.

Note that the portion of the substrate 1210 except a contact portion is covered with a protective film, and a base layer containing a photocatalytic substance is provided over the protective film.

Two connecting regions 1207 provided so as to sandwich the pixel portion are provided for contacting a second electrode of a light-emitting element to a lower wiring. Note that a first electrode of the light-emitting element is electrically connected to a TFT provided in the pixel portion.

A sealing substrate 1204 is fixed to the substrate 1210 by a sealing agent 1205 surrounding the pixel portion and the driver circuits and by a filler surrounded with the sealing agent. In addition, a structure in which a filler including a transparent drying agent is filled may also be employed. The drying agent may be disposed in a region which is not overlapped with the pixel portion.

Figure 8B:
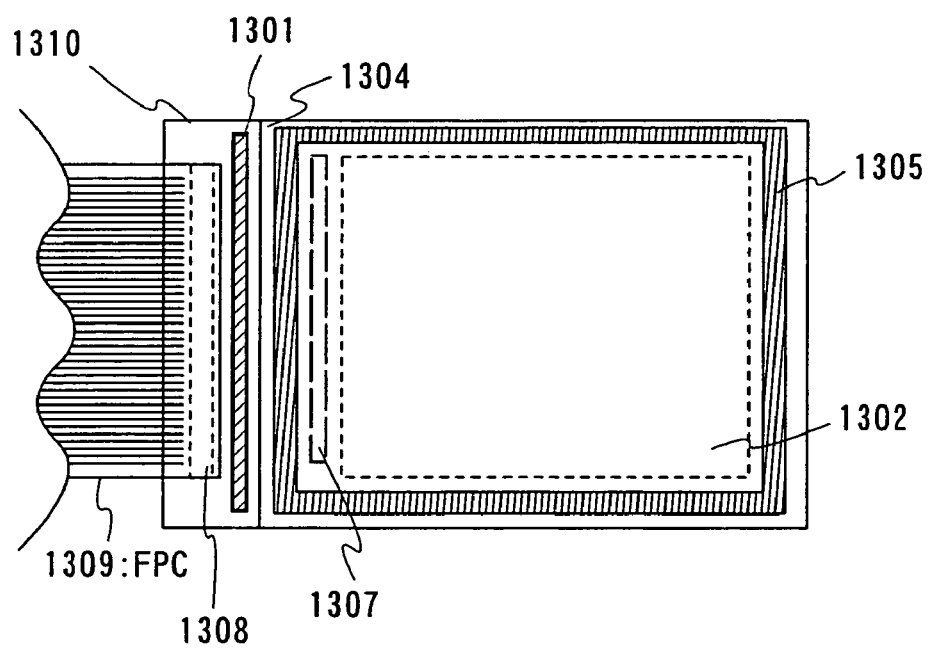

The structure shown in FIG. 8A is a preferred example of a light-emitting device of a relatively large size of XGA class (for example, the opposite angle: 4.3 inches). FIG. 8B is a example of employing a COG mode which is suitable for a small size light-emitting device whose frame is narrowed (for example, the opposite angle: 1.5 inches) is employed.

In FIG. 8B, a driver IC 1301 is mounted on a substrate 1310 and an FPC 1309 is mounted on a terminal portion 1308 disposed at the end of the driver IC. A plurality of the driver ICs 1301 to be mounted are preferably formed over a rectangular substrate to be 300 to 1000 mm or more in one side, from a view point of improving the productivity. In other words, a plurality of circuit patterns having a driver circuit portion and an input-output terminal as a unit are preferably formed over a substrate and separated to be taken out. The driver IC may be formed to be rectangular having a longer side of 15 to 80 mm and a shorter side of 1 to 6 mm. Alternatively, the driver IC may be have a longer side corresponding to one side of a pixel region or a length in which one side of a driving circuit is added to one side of the pixel portion.

The driver IC is superior to an IC chip in terms of an external size, since it has a longer side. When a driver IC formed to be 15 to 80 mm in a longer side is used, the number of driver ICs to be required for being mounted corresponding to the pixel portion is small, as compared with the case of using IC chips, thereby improving the yield in manufacturing. When a driver IC is formed over a glass substrate, the productivity is not lost because there is no limitation on the shape of a mother substrate. This is a great advantage, as compared with the case of taking out an IC chip from a circular silicon wafer.

In addition, a TAB mode may be employed, and in that case, a plurality of tapes are attached and a driver IC may be mounted on the tapes. As in the case of the COG mode, a single driver IC may be mounted on a single tape. In this case, a metal piece or the like for fixing a driver IC is preferably attached together for enhancing the intensity.

The substrate 1310 except a contact portion is covered with a protective film and a base layer containing a photocatalytic substance is provided over the protective film.

A connecting region 1307 provided between a pixel portion 1302 and the driving IC 1301 is provided for contacting a second electrode of a light-emitting element to a lower wiring. Note that the first electrode of the light-emitting element is electrically connected to the TFT provided for the pixel portion.

A sealing substrate 1304 is fixed on the substrate 1310 by a sealing member 1305 surrounding the pixel portion 1302 and by a filler surrounded with the sealing member.

In the case of using an amorphous semiconductor film as an active layer of a TFT, it is difficult to form a driver circuit over the same substrate, and thus, the structure shown in FIG. 8B is employed even when it has a large size.

This embodiment can be freely combined with Embodiment Mode 1, 2, or 3 or Embodiment 1 or 2.

Embodiment 4

Figure 9:
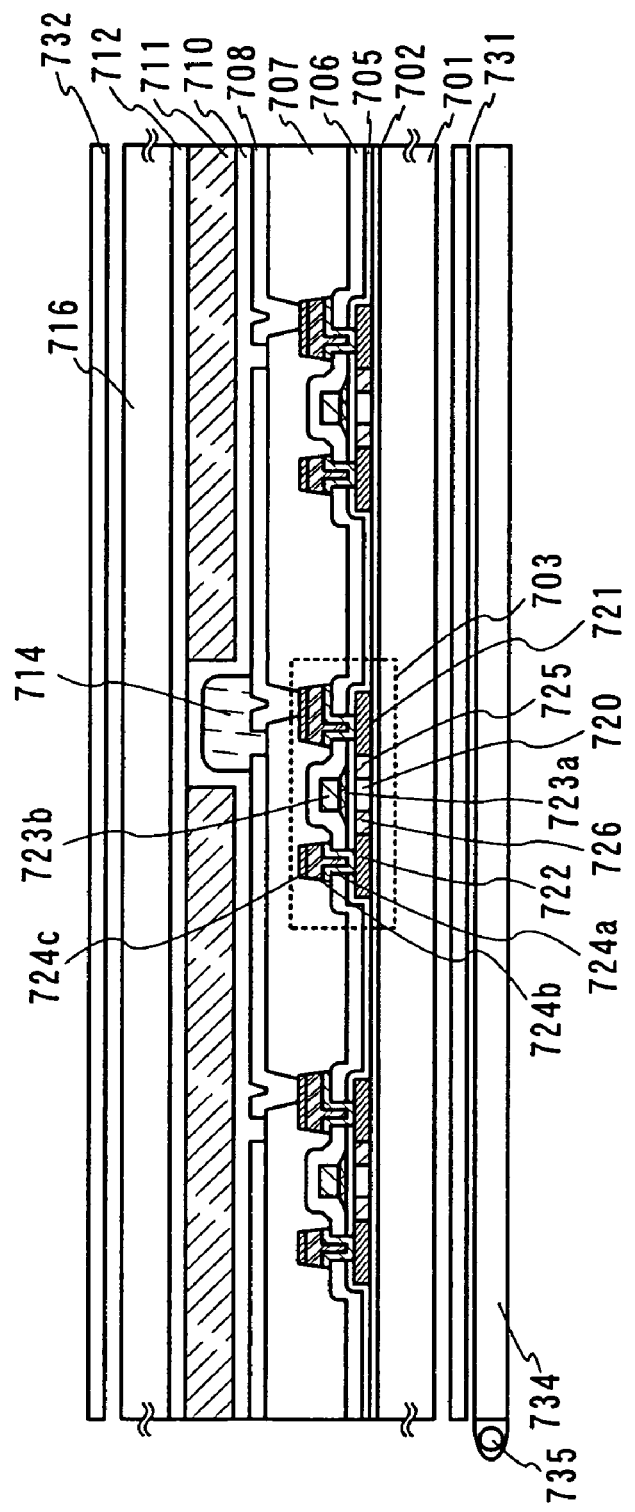
FIG. 9 is a cross sectional view of a liquid crystal panel.

Embodiment 4 describes an example of a liquid crystal display device in which a pixel portion, a driver circuit and a terminal portion are formed on one substrate with reference to FIG. 9. FIG. 9 is a cross sectional view of a liquid crystal panel without a color filter.

An optical shutter is constituted by a polarizing plate and a liquid crystal panel without a color filter and a field sequential system of blinking a backlight light source for three colors of RGB at high speed. The field sequential system is a method of realizing color display by continuous time additive color mixture using limits of human-eye ability about time.

A base insulating film 702 is formed over a first substrate 701 and three TFTs 703 are provided thereover. The TFTs are each an n-channel TFT having a channel forming region 720, low concentration impurity regions 725, 726 and source and drain regions 721, 722 as an active layer, and having a gate insulating film 705, and gate electrodes 723a, and 723b. In addition, the gate electrodes each have a two-layer structure including a first layer 723a having a tapered shape and a second layer 723b.

An interlayer insulating film 706 is an inorganic insulating film formed by a PCVD method. A planarizing insulating film 707 is a flat interlayer insulating film formed by a coating method.

Further, a drain or source wiring of a TFT has a three-layer structure including 724a, 724b and 724c. Here, a stacked film in which a Ti film, a pure aluminum (Al) film and an aluminum carbon alloy film including Ni are formed in this order is used. The drain or source wiring of the TFT preferably has a tapered shape in consideration of the coverage of the interlayer insulating film.

A transparent conductive film such as ITO (indium tin oxide) or ITSO (indium tin oxide containing silicon oxide formed by sputtering using a target made of ITO containing silicon oxide of from 2 to 10% by weight), a light-transmitting conductive oxide film (IZO) including silicon oxide in which 2 to 20% zinc oxide (ZnO) into indium oxide, or antimony tin oxide (ATO) including silicon oxide can be used as a pixel electrode 708. Even when ITO is used as the pixel electrode 708, a defect such as electric corrosion is not generated and thus a favorable ohmic contact can be obtained, because the third conductive layer that is in contact with the pixel electrode is an aluminum carbon alloy film including Ni.

A columnar spacer 714 is formed from resin and has a function of keeping a space between the substrates constant. Therefore, the columnar spacers 714 are arranged at even interval. Moreover, the space between the substrates is preferably 2 μm or less for the sake of a high speed response, and thus the height of the columnar spacers is appropriately adjusted. In addition, in the case of a small screen size with two-inch square or less, the columnar spacer is not necessarily formed, and a gap material such as filler included in a sealing agent may only be used to adjust the space between the substrates.

An orientation film 710 covering the columnar spacer 714 and the pixel electrode 708 is provided. An orientation film 712 is provided for a second substrate 716 serving as an opposite substrate and the first substrate 701 is attached to the second substrate 716 by a sealing agent (not shown).

The space between the first substrate 701 and the second substrate 716 is filled with a liquid crystal material 711. There may be employed a method by which the liquid crystal material 711 is dropped under a reduced pressure so as not to prevent intrusion of bubbles using the sealing agent as a closed pattern and the both substrates are attached to each other, or a dipping method by which a liquid crystal is injected using a capillary phenomenon after a seal pattern having an opening portion is provided and a TFT substrate is attached.

The liquid crystal panel according to this embodiment has a so-called "π cell structure", and uses a display mode called OCB (optically compensated bend) mode. In the π cell structure, liquid crystal molecules are aligned such that pre-tilt angles of the molecules are symmetrical with respect to the center plane between the active matrix substrate and the opposite substrate. The orientation in the π cell structure is splay orientation when the voltage is not applied to the substrates, and shifts into bend orientation when the voltage is applied. Further application of voltage brings liquid crystal molecules in bend orientation to an orientation perpendicular to the substrates, which allows light to transmit therethrough. Note that the OCB mode can provide a response speed about ten times faster than a conventional TN mode.

The liquid crystal panel is interposed between a pair of optical films (such as a polarizing plate or a retardation film) 731 and 732. A biaxial phase difference plate is preferably used because in the OCB mode display, visual angle dependency of retardation is three-dimensionally compensated using biaxial phase difference plates.

As backlight of the liquid crystal panel shown in FIG. 9, an LED 735 for three-color RGB is used. The light from the LED 735 is led out by a light conducting plate 734. In the field sequential driving method, each LED for R, G and B are lightened in order in TR period, TG period and TB period of an LED lightning period. In the TR in which LED for red is lightened, video signals corresponding to red R1 are supplied to the liquid crystal panel and the video signals for one red image are written into the liquid crystal panel. In the TG in which LED for green is lightened, video signals corresponding to green G1 are supplied to the liquid crystal panel and the video signal for one green display are written into the liquid crystal panel. In the TB in which LED for blue is lightened, video signals corresponding to blue B1 are supplied to the liquid crystal panel and the video signals for one blue image are written into the liquid crystal panel. In this manner, one frame is formed by writing the video signals three times.

Embodiment 5

Various electronic devices can be manufactured by incorporating an EL panel or a liquid crystal panel obtained according to the present invention. As an electronic device, a camera such as a video camera or a digital camera, a goggle type display, a navigation system, an audio reproducing device (an in-car audio system, an audio component system, or the like), a personal computer, a game machine, a portable information terminal (a mobile computer, a cellular phone, a portable game machine, an electronic book, or the like), and an image reproducing device provided with a recording medium (specifically, a device which is capable of reproducing a recording medium such as a Digital Versatile Disc (DVD) and provided with a display for displaying the reproduced image). FIGS. 10A to 10H and FIG. 11 show specific examples thereof.

Figure 10A:
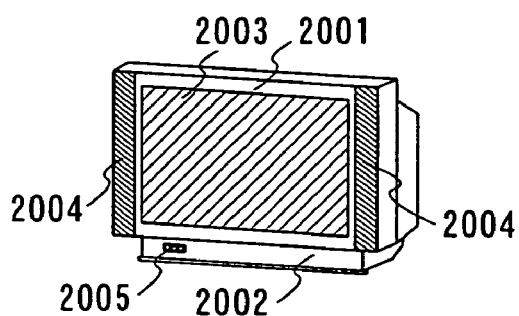
FIGS. 10A to 10H each show an example of an electronic device.

FIG. 10A shows a TV set, which includes a casing 2001, a support 2002, a display portion 2003, a speaker portion 2004, a video input terminal 2005, and the like. The present invention can be applied to a semiconductor integrated circuit embedded in the TV set and the display portion 2003. Thus, the TV set with lower power consumption can be realized. Further, the TV set includes all types of televisions for displaying information such as one for a personal computer, one for receiving TV broadcasting, and one for advertising.

Figure 10B:
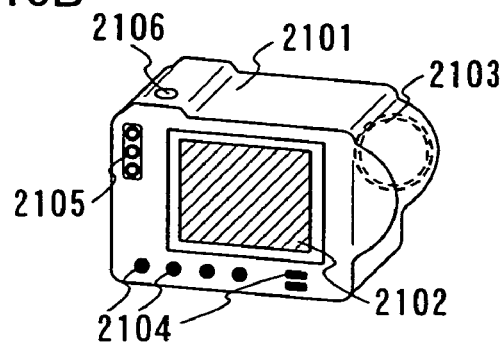

FIG. 10B shows a digital camera, which includes a main body 2101, a display portion 2102, an image receiving portion 2103, an operation key 2104, an external connection port 2105, a shutter 2106, and the like. The present invention is applied to a semiconductor integrated circuit (a memory, a CPU, or the like) embedded in the digital camera and the display portion 2102. Thus, the digital camera with lower power consumption can be realized.

Figure 10C:
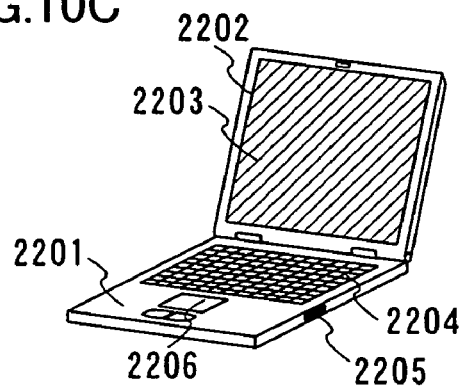

FIG. 10C shows a personal computer, which includes a main body 2201, a casing 2202, a display portion 2203, a keyboard 2204, an external connection port 2205, a pointing mouse 2206, and the like. The present invention is applied to a semiconductor integrated circuit (a memory, a CPU, or the like) embedded in the a personal computer and the display portion 2203. Wiring resistance or contact resistance in a TFT placed in the display portion and a CMOS circuit constituting a CPU can be reduced. Thus, the personal computer lower power consumption can be realized.

Figure 10D:
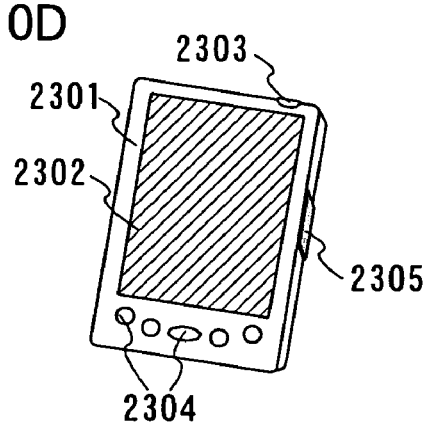

FIG. 10D shows an electronic book, which includes a main body 2301, a display portion 2302, a switch 2303, an operation key 2304, an infrared port 2305, and the like. The present invention is applied to a semiconductor integrated circuit (a memory, a CPU, or the like) embedded in the electronic book and the display portion 2302. Thus, the electronic book with lower power consumption can be realized.

Figure 10E:
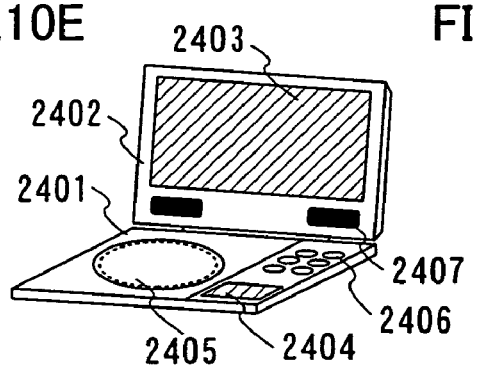

FIG. 10E shows a portable image reproducing device equipped with a recording medium (specifically, a DVD player), which includes a main body 2401, a casing 2402, a display portion A 2403, a display portion B 2404, a recording medium (a DVD and the like) loading portion 2405, an operation key 2406, a speaker portion 2407, and the like. The display portion A 2403 mainly displays image information, and the display portion B 2404 mainly displays character information. The present invention can be applied to a semiconductor integrated circuit (a memory, a CPU, or the like) embedded in the image reproducing device, the display portion A 2403 and the display portion B 2404. Thus, the image reproducing device with lower power consumption can be realized.

Figure 10F:
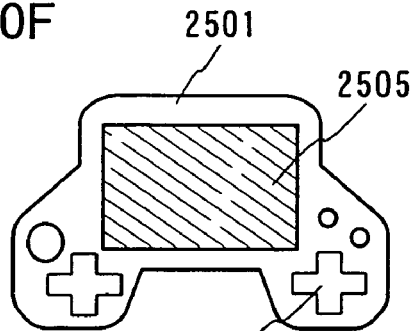

FIG. 10F shows a portable game machine, which includes a main body 2501, a display portion 2505, an operation switch 2504, and the like. The present invention can be applied to a semiconductor integrated circuit (a memory, a CPU, or the like) embedded in the game machine and the display portion 2505. Thus, the portable game machine with lower power consumption can be realized.

Figure 10G:
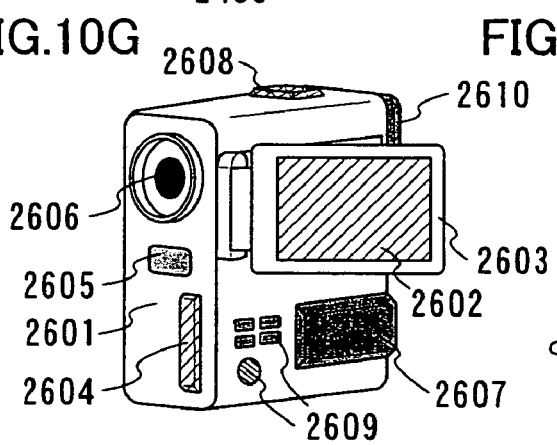

FIG. 10G shows a video camera, which includes a main body 2601, a display portion 2602, a casing 2603, an external connection port 2604, a remote control receiving portion 2605, an image receiving portion 2606, a battery 2607, an audio input portion 2608, an operation key 2609, an eye piece 2610 and the like. The present invention can be applied to a semiconductor integrated circuit (a memory, a CPU, or the like) embedded in the video camera and the display portion 2602. Thus, the video camera with lower power consumption can be realized.

Figure 10H:
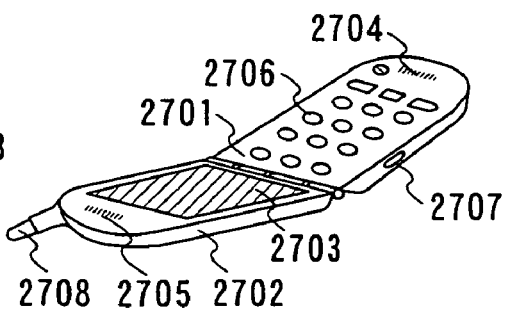

FIG. 10H shows a cellular phone, which includes a main body 2701, a casing 2702, a display portion 2703, an audio input portion 2704, an audio output portion 2705, an operation key 2706, an external connection port 2707, an antenna 2708, and the like. The present invention can be applied to a semiconductor integrated circuit (a memory, a CPU, a high frequency circuit or the like) embedded in the cellular phone and the display portion 2703. Thus, the cellular phone with lower power consumption can be realized.

Figure 11:
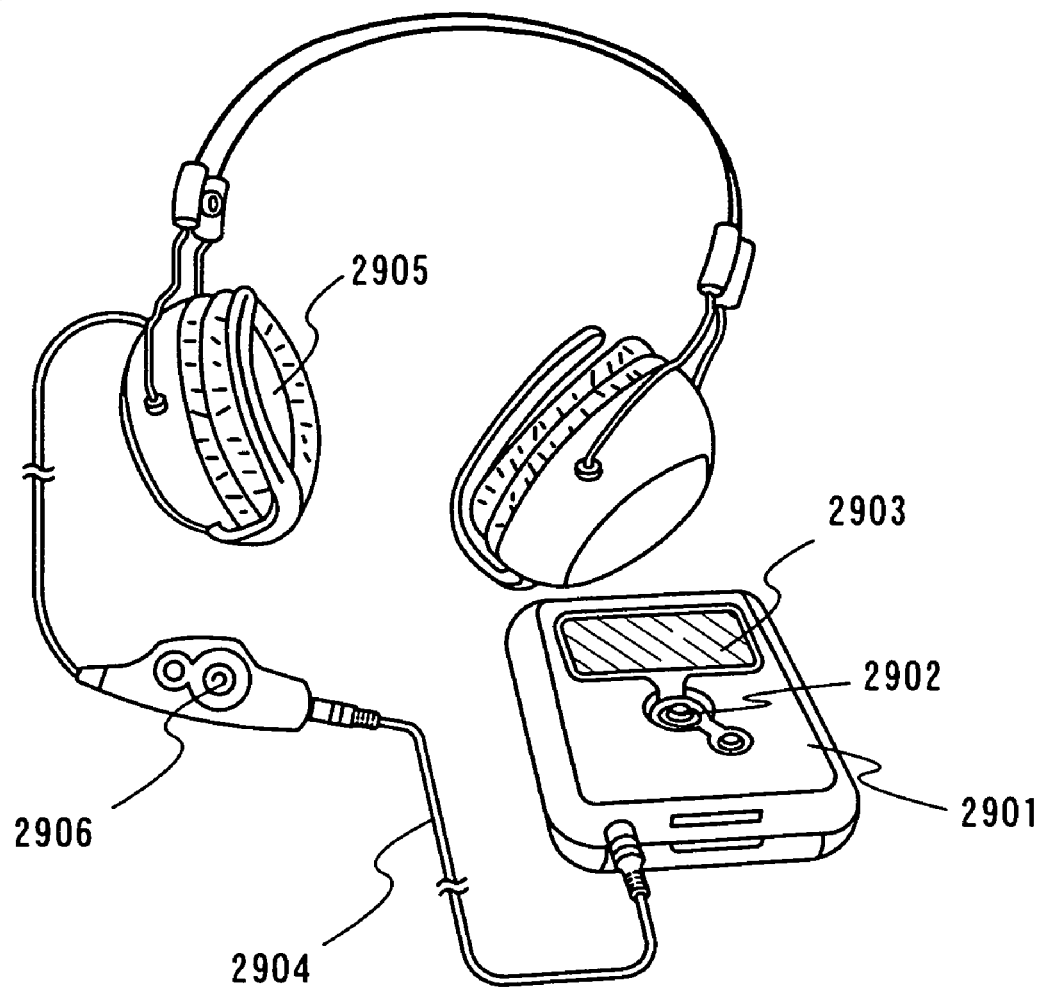
FIG. 11 shows an example of an electronic device.

FIG. 11 shows a portable audio reproducing device provided with a recording medium, which includes a main body 2901, a display portion 2903, a recoding medium (such as a card type memory or a compact HDD) loading portion, operation keys 2902, 2906, a speaker portion 2905 of a headphone connected to a connection cord 2904, and the like. The present invention is applied to the display portion 2903. Thus, the audio reproducing device with lower power consumption can be realized.

This embodiment can be freely combined with Embodiment Mode 1, 2, or 3, or Embodiment 1, 2, 3, 4, or 5.

What is claimed is:

1. A semiconductor device comprising:
    a thin film transistor including a semiconductor film over a substrate having an insulating surface;
    an electrode or a wiring having at least a first conductive layer including titanium or molybdenum, a second conductive layer including aluminum, and a third conductive layer including aluminum and carbon and titanium; and
    a transparent conductive layer which is formed on the third conductive layer,
        wherein the first conductive layer is formed on the semiconductor film,
        wherein the second conductive layer is formed on the first conductive layer,
        wherein the third conductive layer is formed on the second conductive layer, and
        wherein a content of the titanium included in the third conductive layer is 1 atoms % to 20 atoms %.

2. The semiconductor device according to claim 1, wherein the content of the carbon included in the third conductive layer is 0.1 atoms % to 10 atoms %.

3. The semiconductor device according to claim 1, comprising a light-emitting element having the transparent conductive film as an anode or a cathode.

4. The semiconductor device according to claim 1, comprising a liquid crystal element having the transparent conductive film as a pixel electrode.

5. The semiconductor device according to claim 1, wherein the transparent conductive film is ITO or IZO.

6. The semiconductor device according to claim 1, wherein the semiconductor device is a portable information terminal, a camera such as a video camera or a digital camera, or a personal computer.

7. The semiconductor device according to claim 1, wherein the oxygen concentration of the second conductive layer is $1 \times 10^{19}$ atoms/cm$^3$ or less.

8. A semiconductor device comprising:
    a thin film transistor including a semiconductor film over a substrate having an insulating surface;
    an electrode or a wiring having at least a first conductive layer including titanium or molybdenum, a second conductive layer including aluminum, and a third conductive layer including aluminum and carbon and molybdenum; and a transparent conductive layer which is formed on the third conductive layer, wherein the first conductive layer is formed on the semiconductor film, wherein the second conductive layer is formed on the first conductive layer, and wherein the third conductive layer is formed on the second conductive layer.

9. The semiconductor device according to claim 8, wherein the content of the carbon included in the third conductive layer is 0.1 atoms % to 10 atoms %.

10. The semiconductor device according to claim 8, comprising a light-emitting element having the transparent conductive film as an anode or a cathode.

11. The semiconductor device according to claim 8, comprising a liquid crystal element having the transparent conductive film as a pixel electrode.

12. The semiconductor device according to claim 8, wherein the transparent conductive film is ITO or IZO.

13. The semiconductor device according to claim 8, wherein the semiconductor device is a portable information terminal, a camera such as a video camera or a digital camera, or a personal computer.

14. The semiconductor device according to claim 8, wherein the oxygen concentration of the second conductive layer is $1\times10^{19}$ atoms/cm$^3$ less.

15. A semiconductor device comprising:

a thin film transistor including a semiconductor film over a substrate having an insulating surface;

an electrode having at least a first conductive layer including titanium or molybdenum, a second conductive layer including aluminum, and a third conductive layer including aluminum and carbon and titanium;

an insulating layer having an opening formed over the electrode; and a transparent conductive layer which is formed on the insulating layer, wherein the first conductive layer is formed on the semiconductor film, wherein the second conductive layer is formed on the first conductive layer, wherein the third conductive layer is formed on the second conductive layer, and wherein the transparent conductive layer is connected with the third conductive layer in the opening.

16. The semiconductor device according to claim 15, wherein the content of the carbon included in the third conductive layer is 0.1 atoms % to 10 atoms %.

17. The semiconductor device according to claim 15, comprising a light-emitting element having the transparent conductive film as an anode or a cathode.

18. The semiconductor device according to claim 15, comprising a liquid crystal element having the transparent conductive film as a pixel electrode.

19. The semiconductor device according to claim 15, wherein the transparent conductive film is ITO or IZO.

20. The semiconductor device according to claim 15, wherein a content of the titanium included in the third conductive layer is 1 atoms % to 20 atoms %.

21. The semiconductor device according to claim 15, wherein the oxygen concentration of the second conductive layer is $1\times10^{19}$ atoms/cm$^3$ or less.

* * * * *